(12) United States Patent
Roy et al.

(10) Patent No.: US 10,950,498 B2
(45) Date of Patent: Mar. 16, 2021

(54) SELECTIVE AND SELF-LIMITING TUNGSTEN ETCH PROCESS

(71) Applicant: Applied Materials, Inc., Santa Clara, CA (US)

(72) Inventors: Susmit Singha Roy, Sunnyvale, CA (US); Srinivas Gandikota, Santa Clara, CA (US); Pramit Manna, Sunnyvale, CA (US); Abhijit Basu Mallick, Palo Alto, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/583,749

(22) Filed: Sep. 26, 2019

(65) Prior Publication Data

US 2020/0027785 A1    Jan. 23, 2020

Related U.S. Application Data

(63) Continuation-in-part of application No. 16/505,699, filed on Jul. 8, 2019, now Pat. No. 10,622,251, which
(Continued)

(51) Int. Cl.
*H01L 21/301* (2006.01)
*H01L 21/46* (2006.01)
(Continued)

(52) U.S. Cl.
CPC .. *H01L 21/76877* (2013.01); *H01L 21/02175* (2013.01); *H01L 21/02244* (2013.01); *H01L 21/28568* (2013.01); *H01L 21/31122* (2013.01); *H01L 21/76843* (2013.01); *H01L 21/76888* (2013.01); *H01L 23/528* (2013.01); *H01L 23/53266* (2013.01); *H01L 27/11556* (2013.01); *H01L 27/11582* (2013.01)

(58) Field of Classification Search
CPC ......... H01L 21/76877; H01L 21/02165; H01L 21/02244; H01L 21/28568
USPC .......................................... 436/643; 438/643
See application file for complete search history.

(56) References Cited

U.S. PATENT DOCUMENTS 3,649,512 A    3/1972    Ackley
4,826,584 A    5/1989    Dos Santos Pereiro
(Continued)

FOREIGN PATENT DOCUMENTS

KR    20130066950 A    7/2016
TW    201439105 A    10/2014
(Continued)

OTHER PUBLICATIONS

PCT International Search Report and Written Opinion in PCT/US2018/013802 dated Jun. 27, 2018, 15 pages.
(Continued)

*Primary Examiner* — David S Blum
(74) *Attorney, Agent, or Firm* — Servilla Whitney LLC (57) ABSTRACT

Methods of dep-etch in semiconductor devices (e.g. V-NAND) are described. A metal layer is deposited in a feature. The metal layer is removed by low temperature atomic layer etching by oxidizing the surface of the metal layer and etching the oxide in a layer-by-layer fashion. After removal of the metal layer, the features are filled with a metal.

18 Claims, 5 Drawing Sheets

Related U.S. Application Data is a continuation of application No. 15/986,189, filed on May 22, 2018, now Pat. No. 10,354,916.

(60) Provisional application No. 62/513,371, filed on May 31, 2017.

(51) Int. Cl.
 *H01L 21/78*    (2006.01)
 *H01L 21/768*    (2006.01)
 *H01L 21/02*    (2006.01)
 *H01L 27/11582*    (2017.01)
 *H01L 27/11556*    (2017.01)
 *H01L 23/528*    (2006.01)
 *H01L 21/285*    (2006.01)
 *H01L 23/532*    (2006.01)
 *H01L 21/311*    (2006.01)

(56) References Cited

U.S. PATENT DOCUMENTS

| | | |
|---|---|---|
| 6,113,754 A | 9/2000 | Oh et al. |
| 6,235,632 B1 | 5/2001 | Nogami et al. |
| 6,840,427 B2 | 1/2005 | Ivanov |
| 8,865,594 B2 | 10/2014 | Lee et al. |
| 8,912,591 B2 | 12/2014 | Baek et al. |
| 9,972,504 B2 | 5/2018 | Lai et al. |
| 10,229,826 B2 | 3/2019 | Tarafdar et al. |
| 10,354,916 B2 | 6/2019 | Chen et al. |
| 2002/0100680 A1 | 8/2002 | Yamamoto et al. |
| 2006/0260936 A1 | 11/2006 | Hort et al. |
| 2010/0276743 A1 | 11/2010 | Kuniya et al. |
| 2011/0084320 A1 | 4/2011 | Jung |
| 2011/0169067 A1 | 7/2011 | Ernst et al. |
| 2012/0051137 A1 | 3/2012 | Hung et al. |
| 2013/0049095 A1* | 2/2013 | Whang ............... H01L 29/7889 257/321 |
| 2013/0069135 A1* | 3/2013 | Nakahara .......... H01L 27/11521 257/316 |
| 2014/0061039 A1 | 3/2014 | Riker et al. |
| 2014/0273528 A1 | 9/2014 | Niskanen et al. |
| 2016/0343718 A1 | 11/2016 | Lu et al. |
| 2018/0033798 A1 | 2/2018 | Baraskar et al. |
| 2018/0096847 A1 | 4/2018 | Thompson et al. |
| 2018/0211826 A1 | 7/2018 | Wang et al. |
| 2019/0189456 A1 | 6/2019 | Mullick et al. |
| 2019/0273019 A1* | 9/2019 | Mullick ............ H01L 21/31144 |

FOREIGN PATENT DOCUMENTS

| | | |
|---|---|---|
| TW | 201737372 A | 10/2017 |
| WO | 2007024428 A2 | 3/2007 |
| WO | 2017/083113 A1 | 5/2017 |

OTHER PUBLICATIONS

PCT International Search Report and Written Opinion in PCT/US2018/033893 dated Sep. 12, 2018, 9 pages.

Wang, Wei W., et al., U.S. Appl. No. 15/411,579, filed Jan. 20, 2017, 48 pages.

PCT International Search Report and Written Opinion in PCT/US2020/052703 dated Jan. 15, 2021, 9 pages.

\* cited by examiner

SELECTIVE AND SELF-LIMITING TUNGSTEN ETCH PROCESS

CROSS-REFERENCE TO RELATED APPLICATIONS

This application is a continuation-in-part United States patent application No. of U.S. patent application Ser. No. 16/505,699, filed Jul. 8, 2019, which is a continuation of U.S. patent application Ser. No. 15/986,189, filed May 22, 2018, issued as U.S. Pat. No. 10,354,916 on Jul. 16, 2019, which claims priority to U.S. Provisional Application No. 62/513,371, filed May 31, 2017, the entire disclosures of which are hereby incorporated by reference herein.

TECHNICAL FIELD

Embodiments of the disclosure generally relate to methods of filling a gap or feature in a semiconductor device. More specifically, embodiments of the disclosure relate to methods of gap fill in three dimensional semiconductor devices using tungsten.

BACKGROUND

As semiconductor devices continue to increase in design and material component complexity, the selective removal of materials has become critical for continued scaling and improvement of semiconductor devices. Selective atomic layer etching (ALE) has emerged as a precise etching method that employs self-limiting surface reactions. Selective ALE of metal oxides ($MO_x$) is particularly important for a number of semiconductor technologies but can be difficult to accomplish due to the inherent stability of these oxide materials.

V-NAND, or 3D-NAND, structures are used in flash memory applications. V-NAND devices are vertically stacked NAND structures with a large number of cells arranged in blocks. Gate-last wordline formation is currently the mainstream process flow in 3D-NAND manufacturing. Prior to wordline formation, the substrate is a layered oxide stack supported by a memory string. The gap space is filled by tungsten using CVD or ALD. The top/sidewall of the memory stack is also coated with tungsten. The tungsten is removed from the top/sidewall of the stack by etch process (e.g., a reactive-ion etch (RIE) process or radical-based etch process) so that the tungsten exists only inside of the gap space and each tungsten fill is completely separated from other tungsten fills. However, due to the loading effect of the etch process, the separation etch often results in different wordline recess from at the top of the stack than at the bottom. This difference becomes more pronounced with increasing oxide stack layers.

In a multi-tier VNAND tungsten fill, there are challenges in filling tungsten, especially in buried world lines. Deposition-etch cyclic techniques are being pursued to generate better gapfill. Currently, however, there are no cyclic deposition-etch processes available that generate effective tungsten gapfill.

Accordingly, there is a need for improved methods of etching tungsten, particularly in NAND applications.

SUMMARY

One or more embodiments of the disclosure are directed to methods of processing a substrate. In one or more embodiments, a processing method comprises: depositing a metal layer in at least one feature on a substrate; oxidizing the metal to a first depth for form a metal oxide layer on the metal layer; and etching the metal oxide layer to selectively remove the metal oxide layer.

Additional embodiments of the disclosure are directed to methods of processing a substrate. In one or more embodiments, a processing method comprises: depositing a metal layer on a substrate surface, the substrate surface having at least one feature thereon, the at least one feature extending a feature depth from the substrate surface to a bottom surface, the at least one feature having a width defined by a first sidewall and a second sidewall, wherein the metal layer is deposited on the substrate surface, the first sidewall, the second sidewall, and the bottom surface of the at least one feature; and performing a process cycle comprising oxidizing the metal to a first depth for form a metal oxide layer on the metal layer, and etching the metal oxide layer to selectively remove the metal oxide layer.

Further embodiments of the disclosure are directed to methods of processing a substrate. In one or more embodiments, a method of processing a substrate comprises: forming a film stack on a substrate, the film stack comprising a plurality of alternating layers of an oxide material and a nitride material and the film stack have a stack thickness; forming an opening extending a depth from a top of the film stack surface to a bottom surface, the opening having a width defined by a first sidewall and a second sidewall; optionally forming a barrier layer on the film stack surface, and on the first sidewall, the second sidewall, and the bottom surface of the opening, the barrier layer comprising TiN with a thickness in the range of about 20 Å to about 50 Å; depositing a metal layer on the film stack so that the metal layer fills the opening and covers the top of the film stack with a metal layer thickness; and repeatedly oxidizing the surface of the metal layer to form a metal oxide layer and etching the metal oxide layer from the at least one feature until the metal layer is removed, oxidizing the surface comprising exposure to $O_2$ and etching the metal layer oxide comprising exposure to a halide etchant.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. The appended drawings illustrate only typical embodiments of this disclosure and are therefore not to be considered limiting, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" and "wafer" are used interchangeably, both referring to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

Semiconductor fabrication processes often involved the deposition of metals, e.g. tungsten (W), into features, such as, but not limited to, vias or trenches, to form contacts or interconnects. Metals, e.g. tungsten (W), are often deposited into features using chemical vapor deposition (CVD), where a substrate having at least one feature to be filled is exposed to a metal-containing precursor and a reducing agent to deposit the metal into the feature. As devices have shrunk, however, features have become smaller and more challenging to fill by CVD, particularly in advanced logic and memory applications.

One or more embodiments of the disclosure advantageously provide methods of depositing a tungsten film in the gaps of a three-dimensional structure. Some embodiments of the disclosure advantageously provide methods of depositing conformal tungsten oxide films and selective tungsten oxide removal. Some embodiments advantageously provide methods to fill lateral features of a V-NAND with high quality tungsten films with uniform thickness from top to bottom of the oxide stack. In one or more embodiments, the processing methods advantageously do not use a plasma. Additionally, the processing method of one or more embodiments advantageously selectively removes tungsten at a more controlled rate than other dep-etch techniques.

One or more embodiments of the disclosure are directed to methods for wordline separation based on highly conformal metal (e.g., tungsten) oxidation and highly selective metal oxide (e.g., tungsten oxide) removal. The methods can use high temperature or low temperature processes.

One or more embodiments of the disclosure are directed to deposition-etching ("dep-etch") cyclic techniques to generate better gapfill. The method of one or more embodiments facilitates such a dep-etch cyclic process. Additionally, in one or more embodiments, the contact resistance of semiconductor devices is improved because the native oxide is removed from the metal, e.g. tungsten, surface.

Figure 1:
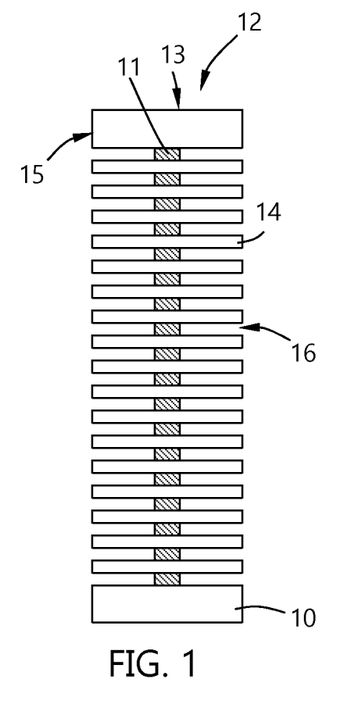
FIG. 1 illustrates a stack of oxide layers in which wordlines will be formed in accordance with one or more embodiment of the disclosure.

Referring to FIG. 1, a substrate 10 has a stack 12 of layers thereon. The substrate 10 can be any suitable substrate material and is not limited to being the same material as any of the individual layers. For example, in some embodiments, the substrate is an oxide, nitride or metal layer. The stack 12 has a plurality of oxide layers 14 that are spaced apart from each other to form gaps 16 between the oxide layers 14 so that each gap forms a wordline or shell for a wordline to be formed. The stack 12 has a top 13 and sides 15.

The stack 12 can have any suitable number of oxide layers 14 or gaps 16. In some embodiments, there are greater than or equal to about 10, 20, 30, 40, 50, 60, 70, 80, 90 or 100 gaps 16 formed in the stack 12 that can be used to form an equal number of wordlines. The number of the gaps 16 is measured on either side of the memory string 11 that connects all of the individual oxide layers 14. In some embodiments, the number of gaps 16 is a multiple of 2. In some embodiments, the number of gaps is equal to $2^n$ where n is any positive integer. In some embodiments, the number of gaps 16 is about 96.

Figure 2:
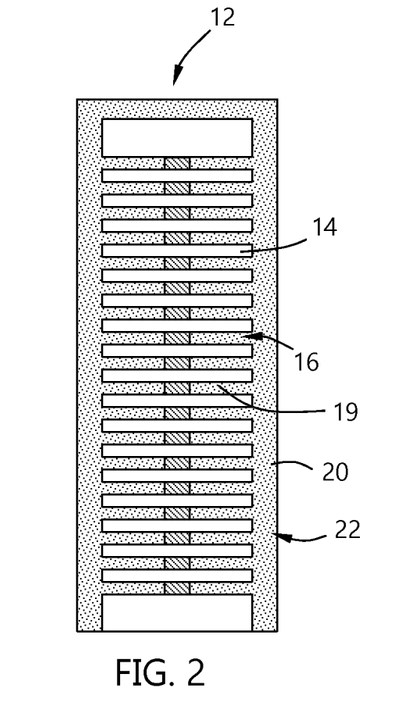
FIG. 2 illustrates a metal film formed on the stack of oxide layers of FIG. 1.

A metal 20 is deposited on the stack 12, as illustrated in FIG. 2. The metal 20 fills the gaps 16 to form wordlines 19. The metal 20 forms is formed all around the stack 12 so that the metal 20 covers the top 13 and sides 15 of the stack 12 with a thickness of metal overburden 22. The overburden 22 is the material that is deposited outside of the gaps 16. The overburden can by any suitable thickness depending on the process used to deposit the metal 20. In some embodiments, the overburden 22 has a thickness in the range of about 1 Å to about 1000 Å. In some embodiments, the overburden 22 has a thickness greater than or equal to about 5 Å, 10 Å, 15 Å, 20 Å, 25 Å, 30 Å, 35 Å, 40 Å, 45 Å or 50 Å.

The metal 20 can be any suitable metal used in wordline applications. In some specific embodiments, the metal film comprises tungsten. In some specific embodiments, the metal film excludes tungsten. In some specific embodiments, the metal film consists essentially of tungsten. As used in this regard, the term "consists essentially of tungsten" means that the composition of the bulk metal film is greater than or equal to about 95%, 98% or 99% tungsten on an atomic basis. The bulk metal film excludes the surface portions of the metal 20 that might contact another surface (e.g., the oxide surface) or is open for further processing as these areas may have some small amount of atomic diffusion with the adjacent material or have some surface moiety like a hydride termination.

The metal 20 can be deposited by any suitable technique including, but not limited to, chemical vapor deposition (CVD) or atomic layer deposition (ALD). The metal 20 is deposited inside the gap space and at the top/sidewall of the memory stack.

Figure 3A:
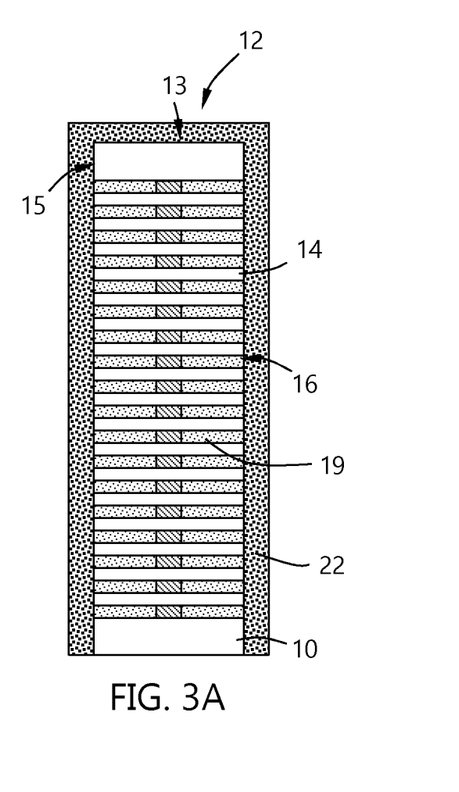
FIGS. 3A and 3B illustrate a high temperature oxidation and etching process in accordance with one or more embodiment of the disclosure.
Figure 3B:
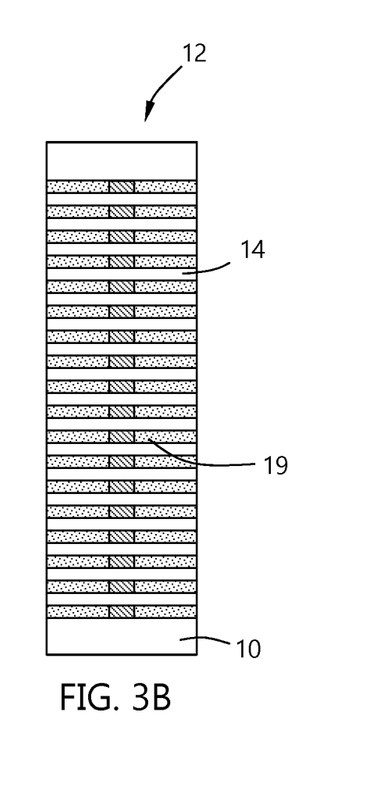

Referring to FIGS. 3A and 3B, a high temperature oxidation with low temperature etch process is illustrated. In FIG. 3A, the metal 20 is oxidized to a metal oxide 25 to a depth about the thickness of the overburden 22. Substantially all of the overburden 22 can be oxidized in a one-step oxidation process. The oxidation of the overburden can be affected by, for example, oxidizing gas flow, oxidizing gas partial pressure, wafer temperature, and process time to form a highly conformal oxidation of the metal overburden 22.

The oxidizing gas can be any suitable oxidizing gas that can react with the metal 20 that has been deposited. Suitable oxidizing gases include, but are not limited to $O_2$, $O_3$, $H_2O$, $H_2O_2$, NO, $NO_2$ or combinations thereof. In some embodiments, the oxidizing gas comprises one or more of $O_2$ or $O_3$. In some embodiments, the oxidizing gas consists essentially of one or more of $O_2$ or $O_3$. As used in this manner, the term "consists essentially of" means that the oxidizing component of the oxidizing gas is greater than or equal to about 95%, 98% or 99% of the stated species. The oxidizing gas can include an inert, diluent or carrier gas. For example, the oxidizing gas can be co-flowed with or diluted in one or more of Ar, He or $N_2$.

The metal oxide 25 of some embodiments comprises tungsten oxide ($WO_x$). In some embodiments, the metal oxide 25 is a derivative of the metal 20 that may or may not include oxygen. Suitable derivatives of the metal film include, but are not limited to, nitride, boride, carbide, oxynitride, oxyboride, oxycarbide, carbonitride, borocarbide, boronitride, borocarbonitride, borooxycarbonitride, oxycarbonitride, borooxycarbide and borooxynitride. Those skilled in the art will understand that the metal film deposited may have a non-stoichiometric amount of atoms with the metal film. For example, a film designated as WO may have different amounts of tungsten and oxygen. The WO film may be, for example, 90 atomic % tungsten. The use of WO to describe a tungsten oxide film means that the film comprises tungsten and oxygen atoms and should not be taken as limiting the film to a specific composition. In some embodiments, the film consists essentially of the designated atoms. For example, a film consisting essentially of WO means that the composition of the film is greater than or equal to about 95%, 98% or 99% tungsten and oxygen atoms.

In the process illustrated by FIGS. 3A and 3B, the oxidation process occurs at high temperature. As used in this regard, the term "high temperature" means a temperature greater than or equal to about 400° C., 450° C., 500° C., 550° C., 600° C., 650° C., 700° C., 750° C., 800° C. or 850° C. In some embodiments, the temperature of the oxidation process is in the range of about 400° C. to about 950° C., or in the range of about 450° C. to about 900° C., or in the range of about 500° C. to about 850° C.

The pressure during the oxidation process can be in the range of about 0.1 Torr to about 760 Torr. The process time (exposure time) can be in the range of about 0.1 seconds to 12 hours. The pressure and process time can be affected by the temperature during the oxidation process.

In some embodiments, the metal 20 of the overburden 22 is oxidized to form a metal oxide 25 on the top 13 and sides 15 of the stack 12 while leaving the metal 20 in the gaps 16 to form the wordlines 19. In some embodiments, substantially all of the metal 20 in the gap 16 remains after oxidation. As used in this manner, the term "substantially all" means that the metal 20 is oxidized to within ±1 Å of the side 15 of the stack 12.

Referring to FIG. 3B, the metal oxide 25 formed from the overburden 22 is etched from the top 13 and sides 15 of the stack 12 to leave the metal 20 in the gaps 14 as wordlines 19. The etch process of some embodiments is a selective etch process that will remove the metal oxide 25 without substantially affecting the metal 20.

In some embodiments, the etchant comprises a metal halide etchant. The etchant of some embodiments consists essentially of a metal halide etchant. As used in this regard, the term "consists essentially of a metal halide etchant" means that the specified metal halide etchant species makes up 95%, 98% or 99% (not including inert, diluent or carrier gas) of the total metal halide etchant species. The metal halide etchant can have the same metal species as the metal oxide 25 or a different metal species. In some embodiments, the metal halide etchant comprises the same metal species as the metal oxide 25.

In some embodiments, the metal halide etchant comprises halogen atoms consisting essentially of chlorine. As used in this regard, the term "consisting essentially of chlorine" means that chlorine makes up greater than or equal to about 95%, 98% or 99% of the halogen atoms in the metal halide etchant on an atomic basis. In some embodiments, the metal halide etchant comprises halogen atoms consisting essentially of fluorine. As used in this regard, the term "consisting essentially of fluorine" means that fluorine makes up greater than or equal to about 95%, 98% or 99% of the halogen atoms in the metal halide etchant on an atomic basis.

In some embodiments, the metal halide etchant comprises one or more of $WF_6$, $WCl_5$, $WCl_6$, or a tungsten oxyhalide. In some embodiments, the metal halide etchant consists essentially of one or more of $WF_6$, $WCl_5$, or $WCl_6$. As used in this regard, the term "consists essentially of" means that the stated species make up greater than or equal to about 95%, 98% or 99% of the metal halide on a molar basis.

The etch temperature of some embodiments is lower than the temperature during oxidation. In some embodiments, the etch temperature is in the range of about 300° C. to about 600° C., or in the range of about 400° C. to about 500° C. In some embodiments, the etch temperature is less than or equal to about 600° C., 550° C., 500° C., 450° C., 400° C. or 350° C. In some embodiments, the temperature during etching is greater than or equal to about 50° C., 75° C., 100° C., 125° C. or 150° C. lower than the temperature during oxidation. In some embodiments, both oxidation and etching occur at a temperature greater than or equal to about 300° C.

After etching the metal oxide 25, the metal overburden 22 is removed and the metal 20 remaining in the gaps 14 as wordlines 19 is substantially even with the sides 15 of the stack 12. As used in this manner, the term "substantially even" means that the wordlines 19 within gaps 16 are within ±1 Å of the side 15 of the stack 12.

The embodiment illustrated in FIGS. 3A and 3B show a high temperature oxidation—low temperature etch process. The embodiment illustrated in FIGS. 4A through 4D show a low temperature oxidation and etch process. Some differences between the processes include, but are not limited to, lower temperature oxidation and slower removal of the overburden.

After the stack 12 has the metal 20 with overburden 22 formed (as in FIG. 2), the removal of the overburden can be performed by an atomic layer etching type process. An atomic layer etch process can include multiple repeating processes that modify a surface to be etched and then volatilize or remove the modified surface, exposing a new surface below.

Figure 4A:
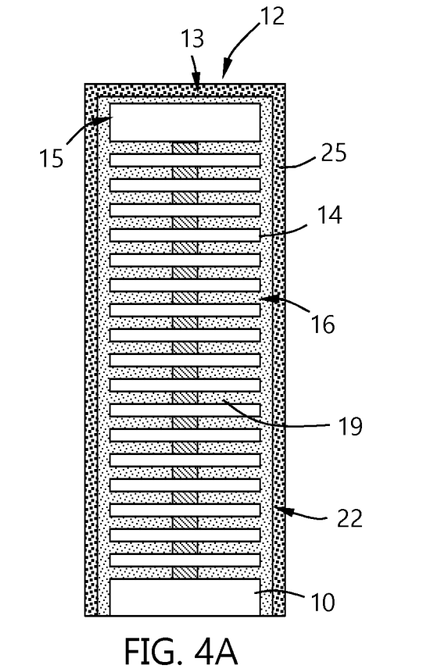
FIGS. 4A through 4D illustrate a low temperature oxidation and etching process in accordance with one or more embodiment of the disclosure.

Referring to FIG. 4A, the overburden 22 is oxidized to form a metal oxide 25 on the surface of the overburden 22. The oxidation process can use the same reagents and parameters as the embodiment illustrated in FIG. 3A with some changes to allow an atomic layer etch (ALE) process to occur. The oxidation process of some embodiments occurs at a temperature in the range of about 300° C. to about 500° C. In some embodiments, the oxidation occurs at a temperature less than or equal to about 500° C., 450° C., 400° C. or 350° C. The pressure during the low temperature oxidation process can be in the range of about 0.1 Torr to about 760 Torr. The process or exposure time can be in the range of about 0.001 second to about 60 seconds. In the atomic layer etch process, each oxidation and etching process is self-limiting in that once the active surface sites have been reacted with, the process stops. For example, once all of the active surface sites of the metal 20 are exposed to and reacted with the oxidizing agent to form the metal oxide 25 film, no further oxidation can readily occur. Similarly, once the etchant has removed the oxide film to expose the fresh metal 20 below, the etchant has no further oxide to remove.

Figure 4B:
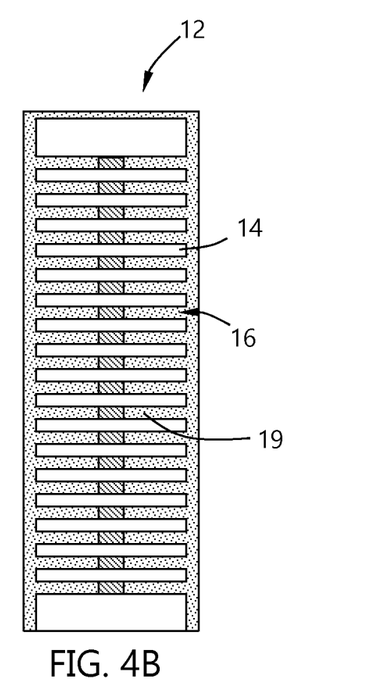

Referring to FIG. 4B, after formation of the metal oxide 25 on the metal 20, the stack 12 is exposed to an etchant. The etchant and etch conditions can be the same as those illustrated and described with respect to FIG. 3B. The metal oxide 25 layer on the metal 20 is thinner than the embodiment illustrated in FIGS. 3A and 3B so the etching process will take less time. In some embodiments, the etchant process time is in the range of about 0.1 second to about 60 seconds.

In some embodiments, the temperature during the oxidation and etching processes occur at a temperature less than or equal to about 400° C. The temperature of the etch process shown in FIG. 4B can be the same as the oxidation process of FIG. 4A so that the substrate containing the stack 12 can be rapidly moved from one process region of a processing chamber to another process region of the processing chamber to sequentially expose the substrate to the oxidation and etch conditions.

This type of ALE process may be referred to as a spatial ALE where the various reactive gases (e.g., oxidant and etchant) are flowed into separate regions of a processing chamber and the substrate is moved between and among the regions. The different process regions are separated by a gas curtain comprising one or more of purge gas streams and/or vacuum streams to prevent mixing of the oxidant and etchant in the gas phase. The ALE process can also be performed by a time-domain process where the processing chamber is filled with the oxidant, purged to remove the excess oxidant and reaction products or by-products, filled with the etchant and then purged to remove excess etchant and reaction products or by-products. In the time-domain process, the substrate can remain stationary.

Figure 4C:
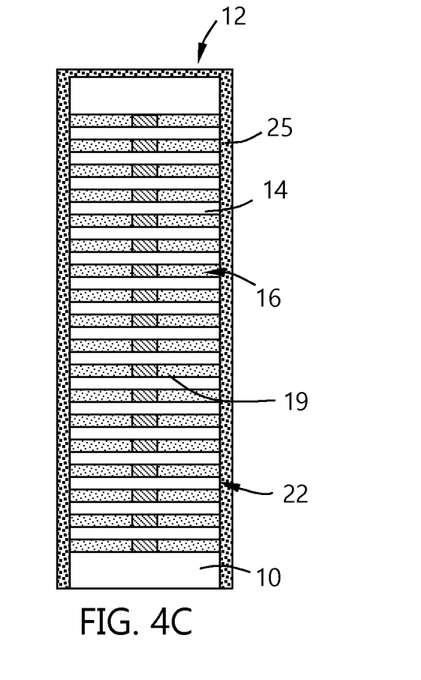
Figure 4D:
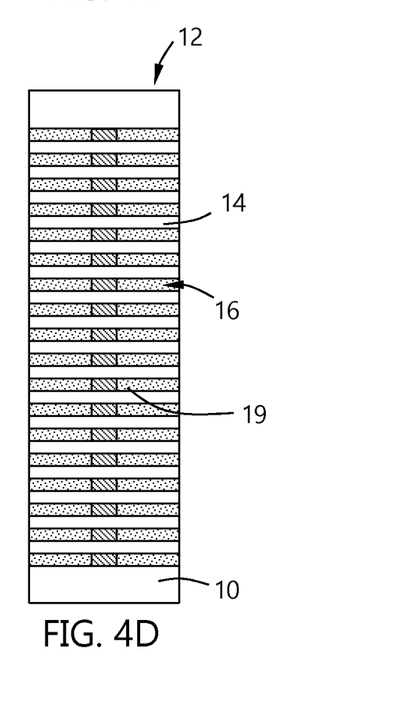

FIGS. 4C and 4D show a repetition of the exposure to the oxidant to form the metal oxide 25 and etchant to remove the metal oxide, respectively. While the process is illustrated as using two cycles, those skilled in the art will understand that this is merely a representation and that more than two cycles may be used to remove the overburden 22 and leave the metal 20 in the gaps 16 as wordlines 19.

In some embodiments, a barrier layer is formed on the oxide layers 14 prior to deposition of the metal 20. The barrier layer can be any suitable barrier material. In some embodiments, the barrier layer comprises titanium nitride. In some embodiments, the barrier layer consists essentially of titanium nitride. As used in this manner, the term "consists essentially of titanium nitride" means that the composition of the barrier layer is greater than or equal to about 95%, 98% or 99% titanium and nitrogen atoms, on an atomic basis. The thickness of the barrier layer can be any suitable thickness. In some embodiments, the barrier layer has a thickness in the range of about 20 Å to about 50 Å.

FIGS. 5A-5D show a partial cross-sectional views of a substrate 100 with a feature 110, and detail an atomic layer etching process according to one or more embodiments of the disclosure. The Figures show substrates having a single feature for illustrative purposes; however, those skilled in the art will understand that there can be more than one feature. The shape of the feature 110 can be any suitable shape including, but not limited to, trenches and cylindrical vias. As used in this regard, the term "feature" means any intentional surface irregularity. Suitable examples of features include, but are not limited to trenches which have a top, two sidewalls and a bottom, peaks which have a top and two sidewalls. Features can have any suitable aspect ratio (ratio of the depth of the feature to the width of the feature). In some embodiments, the aspect ratio is greater than or equal to about 5:1, 10:1, 15:1, 20:1, 25:1, 30:1, 35:1 or 40:1.

Figure 5A:
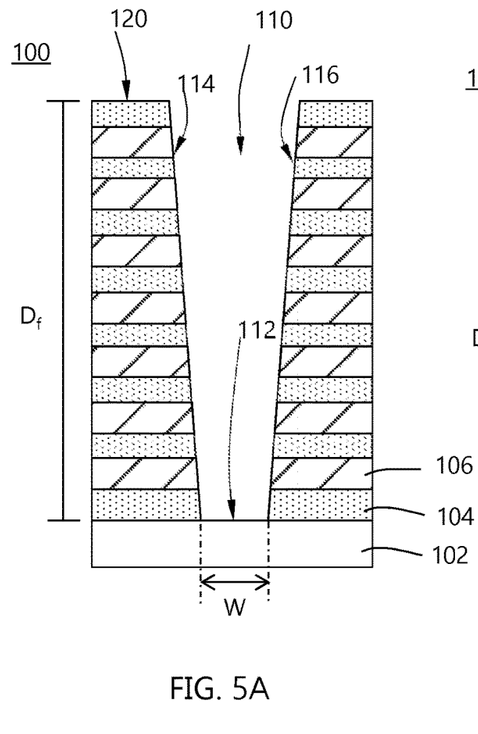
FIGS. 5A-5D illustrates cross-sectional views of a substrate feature in accordance with one or more embodiment of the disclosure.

The substrate 100 has a substrate surface 120. The at least one feature 110 forms an opening in the substrate surface 120. The at least one feature 110 extends from the substrate surface 120 to a feature depth $D_f$ to a bottom surface 112. The at least one feature 110 has a first sidewall 114 and a second sidewall 116 that define a width W of the at least one feature 110. The open area formed by the sidewalls 114, 116 and bottom 112 are also referred to as a gap. In one or more embodiments, the width W is homogenous along the depth D1 of the at least one feature 110. In other embodiments, the width, W, is greater at the top of the at least one feature 110 than the width, W, at the bottom surface 112 of the at least one feature 110.

In one or more embodiments, the substrate 100 is a film stack comprising a plurality of alternating layers of a nitride material 104 and an oxide material 106 deposited on a semiconductor substrate 102.

The semiconductor substrate 102 can be any suitable substrate material. In one or more embodiments, the semiconductor substrate 102 comprises a semiconductor material, e.g., silicon (Si), carbon (C), germanium (Ge), silicon germanium (SiGe), gallium arsenide (GaAs), indium phosphate (InP), indium gallium arsenide (InGaAs), indium aluminum arsenide (InAlAs), germanium (Ge), silicon germanium (SiGe), copper indium gallium selenide (CIGS), other semiconductor materials, or any combination thereof. In one or more embodiments, the semiconductor substrate 102 comprises one or more of silicon (Si), germanium (Ge), gallium (Ga), arsenic (As), indium (In), phosphorus (P), copper (Cu), or selenium (Se). Although a few examples of materials from which the substrate 102 may be formed are described herein, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

In one or more embodiments, the at least one feature 110 comprises a memory hole or a word line slit. Accordingly, in one or more embodiments, the substrate 100 comprises a memory device or a logic device, e.g. NAND, V-NAND, DRAM, or the like.

As used herein, the term "3D NAND" refers to a type of electronic (solid-state) non-volatile computer storage memory in which the memory cells are stacked in multiple layers. 3D NAND memory generally includes a plurality of memory cells that include floating-gate transistors. Traditionally, 3D NAND memory cells include a plurality of NAND memory structures arranged in three dimensions around a bit line.

As used herein, the term "dynamic random access memory" or "DRAM" refers to a memory cell that stores a datum bit by storing a packet of charge (i.e., a binary one), or no charge (i.e., a binary zero) on a capacitor. The charge is gated onto the capacitor via an access transistor, and sensed by turning on the same transistor and looking at the voltage perturbation created by dumping the charge packet on the interconnect line on the transistor output. Thus, a single DRAM cell is made of one transistor and one capacitor.

Figure 5B:
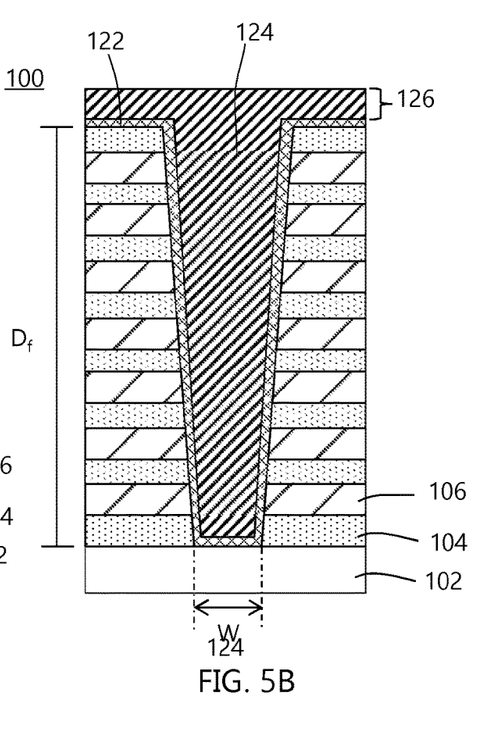

With reference to FIG. 5B, a metal layer 124 is deposited in the at least one feature 110. In one or more embodiments, the metal layer 124 comprises one or more of tungsten (W), titanium (Ti), tantalum (Ta), nickel (Ni), cobalt (Co), or molybdenum (Mo). In one or more embodiments, the metal layer 124 comprises one or more of tungsten (W). In one or more embodiments, the metal layer 124 is deposited with an overburden 126. In some embodiments, a conformal liner 122 is deposited in the at least one feature 110 prior to deposition of the metal layer 124. The conformal liner 122 may comprise any suitable material known to one of skill in the art. In one or more embodiments, the conformal liner 122 comprises one or more of titanium nitride (TiN) or tantalum nitride (TaN).

Figure 5C:
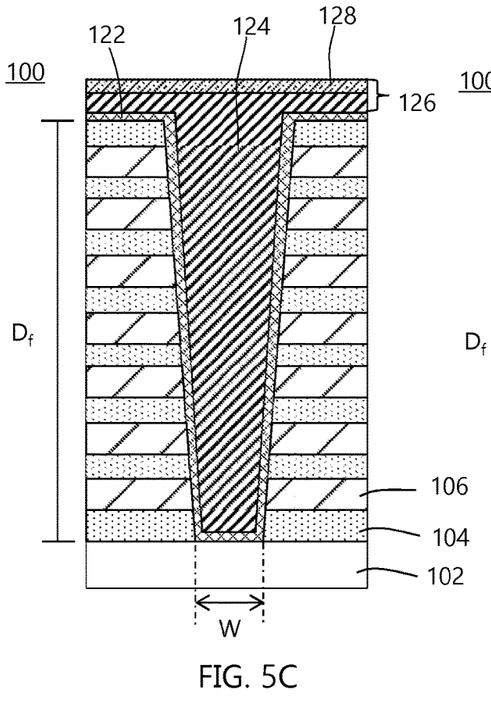

Referring to FIG. 5C, after the metal layer 124 with overburden 126, and optionally, the conformal liner 122, has been deposited, the removal of the overburden 126 can be performed by an atomic layer etching type process. An atomic layer etch process can include multiple repeating processes that modify a surface to be etched and then volatilize or remove the modified surface, exposing a new surface below.

Referring to FIG. 5C, the overburden 126 is oxidized to form a metal oxide layer 128 on the surface of the overburden 126. In one or more embodiments, the metal layer 122 is oxidized to a metal oxide layer 128 to a depth about the thickness of the overburden 126. Substantially all of the overburden 126 can be oxidized in a one-step oxidation process. The oxidation of the overburden 126 can be affected by, for example, oxidizing gas flow, oxidizing gas partial pressure, wafer temperature, and process time to form a highly conformal oxidation of the metal overburden 126.

In one or more embodiments, the oxidizing gas ise any suitable oxidizing gas that can react with the metal layer 122 that has been deposited. Suitable oxidizing gases include, but are not limited to $O_2$, $O_3$, $H_2O$, $H_2O_2$, NO, $NO_2$ or combinations thereof. In some embodiments, the oxidizing gas comprises one or more of $O_2$ or $O_3$. In some embodiments, the oxidizing gas consists essentially of one or more of $O_2$ or $O_3$. As used in this manner, the term "consists essentially of" means that the oxidizing component of the oxidizing gas is greater than or equal to about 95%, 98% or 99% of the stated species. The oxidizing gas can include an inert, diluent or carrier gas. For example, the oxidizing gas can be co-flowed with or diluted in one or more of Ar, He or $N_2$.

The metal oxide layer 128 of some embodiments comprises tungsten oxide ($WO_x$). In some embodiments, the metal oxide layer 128 is a derivative of the metal layer 122 that may or may not include oxygen. Suitable derivatives of the metal layer 122 include, but are not limited to, nitride, boride, carbide, oxynitride, oxyboride, oxycarbide, carbonitride, borocarbide, boronitride, borocarbonitride, borooxycarbonitride, oxycarbonitride, borooxycarbide and borooxynitride. Those skilled in the art will understand that the metal layer 122 deposited may have a non-stoichiometric amount of atoms with the metal film. For example, a metal layer 122 designated as WO may have different amounts of tungsten and oxygen. The WO film may be, for example, 90 atomic % tungsten. The use of WO to describe a tungsten oxide film means that the film comprises tungsten and oxygen atoms and should not be taken as limiting the film to a specific composition. In some embodiments, the film consists essentially of the designated atoms. For example, a film consisting essentially of WO means that the composition of the film is greater than or equal to about 95%, 98% or 99% tungsten and oxygen atoms.

In the process illustrated by FIGS. 5A to 5D, the oxidation process occurs at high temperature, such that the oxidation is a thermal oxidation or a rapid thermal oxidation or a spike anneal process. As used in this regard, the term "high temperature" means a temperature greater than or equal to about 400° C., 450° C., 500° C., 550° C., 600° C., 650° C., 700° C., 750° C., 800° C. or 850° C. In some embodiments, the temperature of the oxidation process is in the range of about 400° C. to about 950° C., or in the range of about 450° C. to about 900° C., or in the range of about 500° C. to about 850° C.

In one or more embodiments, the pressure during the oxidation process is in the range of about 0.1 Torr to about 760 Torr. The process time (exposure time) can be in the range of about 0.1 seconds to 12 hours. The pressure and process time can be affected by the temperature during the oxidation process.

In some embodiments, the metal layer 124 of the overburden 126 is oxidized to form a metal oxide layer 128 on the top 130 and sides 132 of the at least one feature 110 while leaving the metal layer 124 in the at least one feature 110. In some embodiments, substantially all of the metal layer 124 in the at least one feature 110 remains after oxidation. As used in this manner, the term "substantially all" means that the metal layer 124 is oxidized to within ±1 Å of the side 132 of the at least one feature 110.

Figure 5D:
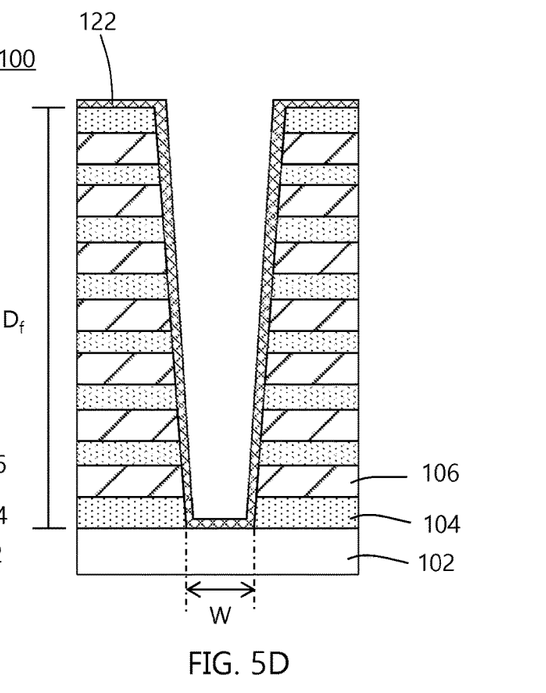

Referring to FIG. 5D, the metal oxide layer 128 formed from the overburden 126 is etched from the top 130 and sides 132 to leave the metal layer 124. The etch process of some embodiments is a selective etch process that will remove the metal oxide layer 128 without substantially affecting the metal layer 124.

In some embodiments, the etchant comprises a metal halide etchant. The etchant of some embodiments consists essentially of a metal halide etchant. As used in this regard, the term "consists essentially of a metal halide etchant" means that the specified metal halide etchant species makes up 95%, 98% or 99% (not including inert, diluent or carrier gas) of the total metal halide etchant species. The metal halide etchant can have the same metal species as the metal oxide layer 128 or a different metal species. In some embodiments, the metal halide etchant comprises the same metal species as the metal oxide layer 128.

In some embodiments, the metal halide etchant comprises halogen atoms consisting essentially of chlorine. In other embodiments, the metal halide etchant comprises halogen atoms consisting essentially of fluorine. As used in this regard, the term "consisting essentially of fluorine" means that fluorine makes up greater than or equal to about 95%, 98% or 99% of the halogen atoms in the metal halide etchant on an atomic basis.

In some embodiments, the metal halide etchant comprises one or more of $WF_6$, $WCl_5$, $WCl_6$, or tungsten oxyhalide. In some embodiments, the metal halide etchant consists essentially of one or more of $WF_6$, $WCl_5$, $WCl_6$, or tungsten oxyhalide. As used in this regard, the term "consists essentially of" means that the stated species make up greater than or equal to about 95%, 98% or 99% of the metal halide on a molar basis.

The etch temperature of some embodiments is lower than the temperature during oxidation. In some embodiments, the etch temperature is in the range of about 100° C. to about 600° C., or in the range of about 100° C. to about 500° C. In some embodiments, the etch temperature is less than or equal to about 600° C., 550° C., 500° C., 450° C., 400° C. or 350° C. In some embodiments, the temperature during etching is greater than or equal to about 50° C., 75° C., 100°

C., 125° C. or 150° C. lower than the temperature during oxidation. In some embodiments, etching occurs at about 300° C. In some embodiments, both oxidation and etching occur at a temperature greater than or equal to about 400° C.

The oxidation process of some embodiments occurs at a temperature in the range of about 300° C. to about 500° C. In some embodiments, the oxidation occurs at a temperature less than or equal to about 500° C., 450° C., 400° C. or 350° C. The pressure during the low temperature oxidation process can be in the range of about 0.1 Torr to about 760 Torr. The process or exposure time can be in the range of about 0.001 second to about 60 seconds. In the atomic layer etch process, each oxidation and etching process is self-limiting in that once the active surface sites have been reacted with, the process stops. For example, once all of the active surface sites of the metal layer 124 are exposed to and reacted with the oxidizing agent to form the metal oxide layer 128, no further oxidation can readily occur. Similarly, once the etchant has removed the metal oxide layer 128 to expose the fresh metal layer 124 below, the etchant has no further oxide to remove.

Referring to FIG. 5D, after formation of the metal oxide layer 128 on the metal layer 124, the substrate 102 is exposed to an etchant. The etchant and etch conditions can be the same as those illustrated and described above. In some embodiments, the etchant process time is in the range of about 0.1 second to about 60 seconds.

In one or more embodiments, this type of ALE process may be referred to as a spatial ALE where the various reactive gases (e.g., oxidant and etchant) are flowed into separate regions of a processing chamber and the substrate is moved between and among the regions. The different process regions are separated by a gas curtain comprising one or more of purge gas streams and/or vacuum streams to prevent mixing of the oxidant and etchant in the gas phase. The ALE process can also be performed by a time-domain process where the processing chamber is filled with the oxidant, purged to remove the excess oxidant and reaction products or by-products, filled with the etchant and then purged to remove excess etchant and reaction products or by-products. In the time-domain process, the substrate can remain stationary.

After etching the metal oxide 128, the process is repeated—the metal layer 124 is oxidized to form a metal oxide layer 128, which is then etched to remove the oxide layer. While the process is illustrated as using a single cycle, those skilled in the art will understand that this is merely a representation and that many more than two cycles may be used to remove the metal layer 124. In one or more embodiments, the process is repeated n number of process cycles. In one or more embodiments, n is a number in a range of about 2 to about 2000. In other embodiments, n is a number greater than about 10, greater than about 25, greater than about 50, greater than about 75, or greater than about 100.

The process is completed in a layer-by-layer-like method until the metal layer 124 is selectively removed from the at least one feature 110, as illustrated in FIG. 5D. In some embodiments, as illustrated, the conformal liner 122 remains. In other embodiments, not illustrate, the conformal liner 122 is etched such that it is partially or completely removed from the at least one feature. In one or more embodiments, the metal layer 124 is removed selectively such that the dielectric materials (e.g. silicon oxide, silicon nitride layers 104, 106) are not affected.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A processing method comprising:
   depositing a conformal liner in at least one feature on a substrate;
   wherein the conformal liner comprises one or more of titanium nitride (TiN) or tantalum nitride (TaN);
   depositing a metal layer on the conformal liner in the least one feature, the metal layer comprising a metal;
   oxidizing the metal to a first depth to form a metal oxide layer on the metal layer; and
   etching the metal oxide layer to selectively remove the metal oxide layer.

2. The method of claim 1, wherein the metal comprises one or more of tungsten (W), titanium (Ti), tantalum (Ta), nickel (Ni), cobalt (Co), or molybdenum (Mo).

3. The method of claim 2, wherein the metal comprises tungsten (W).

4. The method of claim 1, wherein the metal oxide layer comprises tungsten oxide (WO).

5. The method of claim 1, wherein oxidizing the metal occurs at a temperature greater than or equal to 400° C.

6. The method of claim 1, wherein etching the metal oxide layer occurs at a temperature in a range of about 100° C. to about 500° C.

7. The method of claim 1, wherein etching the metal oxide comprises exposing the metal oxide to a metal halide etchant.

8. The method of claim 7, wherein the metal halide etchant comprises one or more of $WF_6$, $WCl_5$, $WCl_6$, or tungsten oxyhalide.

9. A processing method comprising:
   depositing a metal layer on a substrate surface, the substrate surface having at least one feature thereon, the at least one feature extending a feature depth from the substrate surface to a bottom surface, the at least one feature having a width defined by a first sidewall and a second sidewall, wherein the metal layer is deposited on the substrate surface, the first sidewall, the second sidewall, and the bottom surface of the at least one feature; and
   performing a process cycle comprising oxidizing the metal to a first depth for form a metal oxide layer on the metal layer, and etching the metal oxide layer to selectively remove the metal oxide layer.

10. The method of claim 9, wherein the metal comprises tungsten (W) and the metal oxide layer comprises tungsten oxide (WO).

11. The method of claim 9, further comprising depositing a conformal liner in the at least one feature prior to depositing the metal layer, wherein the conformal liner comprises one or more of titanium nitride (TiN) or tantalum nitride (TaN).

12. The method of claim 9, wherein oxidizing the metal occurs at a temperature greater than or equal to 400° C.

13. The method of claim 9, wherein etching the metal oxide layer occurs at a temperature in a range of about 100° C. to about 500° C.

14. The method of claim 9, wherein etching the metal oxide comprises exposing the metal oxide to a metal halide etchant comprising one or more of $WF_6$, $WCl_5$, $WCl_6$, or tungsten oxyhalide.

15. The method of claim 9, further comprising repeating the process cycle n number of times.

16. The method of claim 9, wherein oxidizing the metal layer comprises exposing a surface of the metal layer to oxygen ($O_2$).

17. The method of claim 9, wherein the substrate comprises a plurality of alternating oxide and nitride layers.

18. A method of processing a substrate, the method comprising:
- forming a film stack on a substrate, the film stack comprising a plurality of alternating layers of an oxide material and a nitride material and the film stack have a stack thickness;
- forming an opening extending a depth from a top of the film stack surface to a bottom surface, the opening having a width defined by a first sidewall and a second sidewall;
- optionally forming a barrier layer on the film stack surface, and on the first sidewall, the second sidewall, and the bottom surface of the opening, the barrier layer comprising TiN with a thickness in the range of about 20 Å to about 50 Å;
- depositing a metal layer on the film stack so that the metal layer fills the opening and covers the top of the film stack with a metal layer thickness; and
- repeatedly oxidizing the surface of the metal layer to form a metal oxide layer and etching the metal oxide layer from the at least one feature until the metal layer is removed, oxidizing the surface comprising exposure to $O_2$ and etching the metal layer oxide comprising exposure to a halide etchant.

* * * * *

UNITED STATES PATENT AND TRADEMARK OFFICE
CERTIFICATE OF CORRECTION

PATENT NO. : 10,950,498 B2
APPLICATION NO. : 16/583749
DATED : March 16, 2021
INVENTOR(S) : Susmit Singha Roy et al.

Page 1 of 1

It is certified that error appears in the above-identified patent and that said Letters Patent is hereby corrected as shown below:

In the Specification

Column 9, Line 33, replace "ise" with "is" after "oxidizing gas".

In the Claims

Column 12, Claim 9, Line 65, replace "for" with "to" after "first depth".

Signed and Sealed this
Twenty-seventh Day of April, 2021

Drew Hirshfeld
*Performing the Functions and Duties of the*
*Under Secretary of Commerce for Intellectual Property and*
*Director of the United States Patent and Trademark Office*